United States Patent [19]

Singer

[11] 4,455,527

[45] Jun. 19, 1984

[54] MAGNETIC RESONANCE APPARATUS

[75] Inventor: Leonard S. Singer, Berea, Ohio

[73] Assignee: Union Carbide Corporation, Danbury, Conn.

[21] Appl. No.: 393,391

[22] Filed: Jun. 29, 1982

[51] Int. Cl.³ .......................................... G01R 33/08
[52] U.S. Cl. ..................................... 324/316; 324/318
[58] Field of Search ........................ 324/300, 316, 318

[56] References Cited

U.S. PATENT DOCUMENTS 3,090,003  5/1963  Rempel et al. ........................ 324/0.5
3,771,054  11/1973  Hyde ..................................... 324/316
4,296,378  10/1981  King ..................................... 324/316

OTHER PUBLICATIONS

G. E. Smith, Conversion of an E-3ESR Spectrometer to 1-MHz Field Modulation, Rev. Sci. Instrum., vol. 48, No. 3, Mar. 1977, pp. 282-286.

Primary Examiner—Michael J. Tokar
Attorney, Agent, or Firm—David Fink

[57] ABSTRACT

A magnetic resonance apparatus uses a first harmonic signal produced by magnetic field modulation as a correction signal and the second harmonic signal to provide a property of a sample.

4 Claims, 1 Drawing Figure

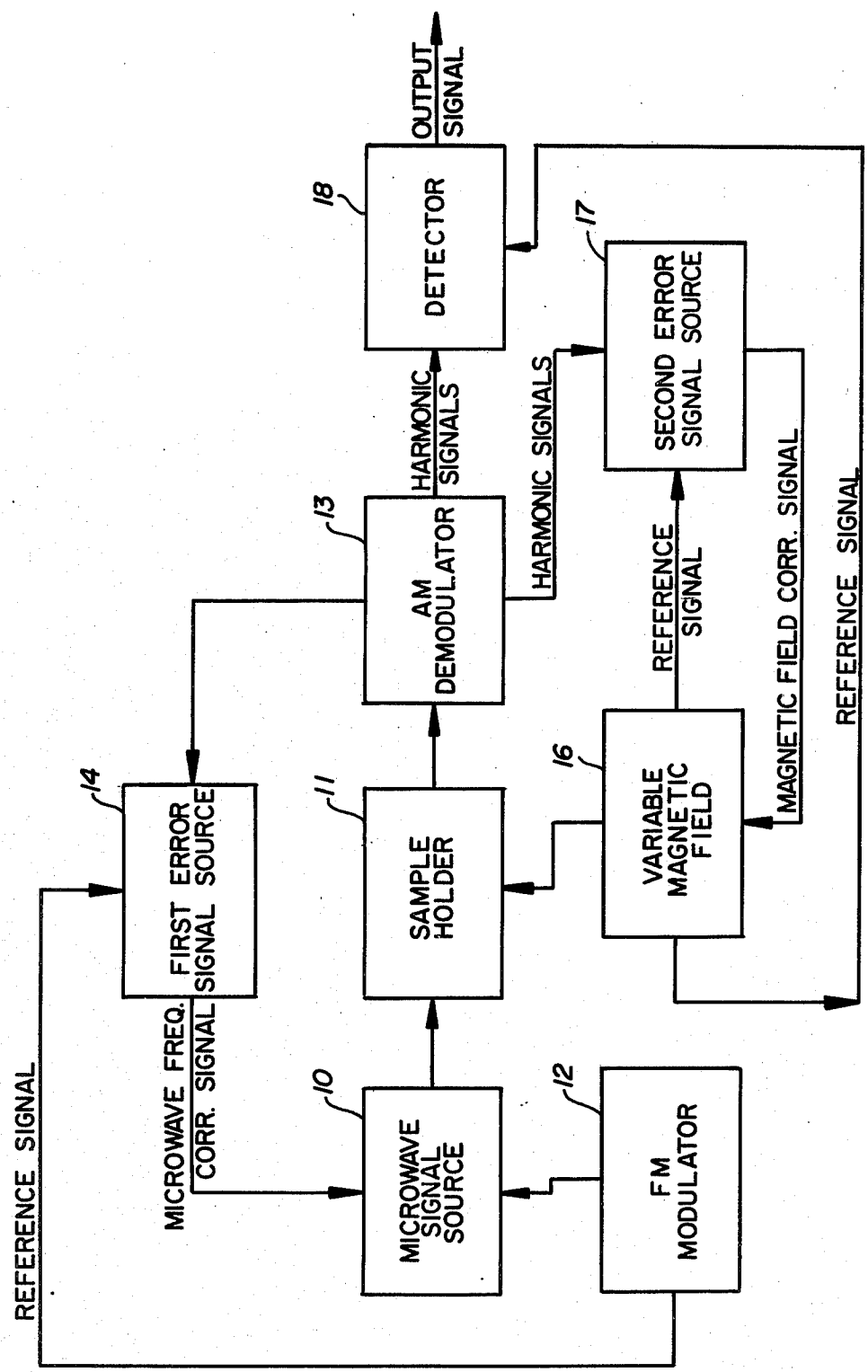

MAGNETIC RESONANCE APPARATUS

The invention relates to a magnetic resonance apparatus and particularly to an electron paramagnetic resonance apparatus.

The importance of measuring magnetic resonance properties of materials is well established and basically such measurements are designated as either nuclear magnetic resonance (NMR) or electron paramagnetic resonance (EPR). The latter is often referred to as electron spin resonance and can provide a measure of the concentration of unpaired electrons in a sample.

One of difficulties in making magnetic resonance measurements resides in maintaining accuracy and repeatability, and thus the equipment required can be highly complex and physically large. This is particularly true for electron paramagnetic resonance which usually requires the use of electromagnetic radiation at microwave frequencies.

The invention is an apparatus which can be assembled in part from commercially available system components and which enables measurements to be carried out with simplicity and accuracy by even an unskilled operator.

In its broadest embodiment, the invention is a magnetic resonance apparatus comprising first means for producing a microwave signal having a microwave frequency; second means for holding a sample to be irradiated by the microwave signal; third means for producing in the region of the sample a magnetic field that is modulated with respect to a reference magnetic field level; the sample exhibiting a maximum resonance absorption at the reference magnetic field level and the microwave frequency; whereby the modulated magnetic field causes the absorbance of the sample to vary in synchronism with the magnetic field modulation resulting in amplitude modulation of the microwave signal containing first and second harmonic components with respect to the frequency of the modulated magnetic field; fourth means for demodulating the microwave signal to obtain the first and second harmonic signals; fifth means for producing a magnetic field correction signal from the first harmonic signal to change the reference magnetic field level to maintain the maximum microwave signal absorption of the sample at the microwave frequency; and output means for the second harmonic signal; whereby the second harmonic signal provides a property of the sample.

The apparatus in a preferred embodiment includes second means comprising a resonant microwave means for producing a microwave resonant response and further includes modulating means for frequency modulating the microwave signal to produce a microwave frequency correction signal for the first means in order to maintain the microwave signal at the resonant frequency of the resonant microwave means.

A further preferred embodiment features the magnetic field being produced by a combination of at least two separate electromagnetic coils, one to produce a reference magnetic field level and the other to produce a magnetic field modulation. In addition, a permanent magnet can be used as part of the reference magnetic field level.

Yet another preferred embodiment of the invention features the use of phase-sensitive detectors for detecting the first and second harmonic signals. Phase-sensitive detectors are commercially available and sometimes designated as lock-in amplifiers. The phase-sensitive detectors compare a signal to a reference signal to produce an output signal correlated to the reference signal.

For a fuller understanding of the nature and objects of the invention, reference should be had to the following detailed description, taken in connection with the accompanying drawings, in which:

The FIGURE shows a block diagram of a best mode of the invention.

The block diagram of FIG. 1 will be described in connection with measurement of electron paramagnetic resonance. It is well known that such measurements are usually made at frequencies in the range of nine to ten GHz for convenience. In carrying out such measurements, a waveguide cavity is used to concentrate the microwaves and to hold the sample to be measured. The microwave frequency used to carry out the measurements must be within the bandpass of the waveguide cavity as well as at the frequency corresponding to the maximum magnetic resonance absorption of the sample, as is well known in the prior art.

A microwave source 10 produces a microwave signal at a frequency suitable for making the electron paramagnetic resonance measurement. Microwave source 10 can be a solid-state Gunn oscillator and can include an attenuator in its output circuit in order to enable the output microwave power to be varied. In the best mode, a calibrated variable attenuator is used in order to enable the predetermined selection of output microwave power level. The selected microwave power level varies in accordance with the type of sample to be evaluated.

In the best mode, it is desirable to compensate for the possible frequency variation of the microwave signal source 10 in order to maintain the frequency at the center of the bandpass of the sample cavity 11. This compensation is accomplished by the use of modulator 12 which can frequency modulate the microwave signal produced by the microwave source 10. The sample cavity 11, which is characterized by a certain frequency bandpass, interacts with the frequency modulated microwave signal above and below the resonant frequency response of the bandpass in a manner similar to a frequency discriminator and thereby results in amplitude modulation of the microwave signal at the same frequency as the frequency modulation. The detection of the amplitude modulation by demodulator 13 is used by a first error signal source 14 to develop a microwave frequency correction signal to maintain the frequency of the microwave source 10 at the center of the bandpass of the sample cavity 11. The first error signal source 14 also determines the positive or negative sense of the amplitude modulated signal by comparing the amplitude modulated signal with the modulation signal produced by the modulator 12 so that the direction for correcting the frequency of the microwave source 10 is established.

The sample placed in the sample holder 11 can be in several different forms. It can be a solid or a liquid measured out to be a predetermined volume or weight, or it can be a continuous flow of a liquid through an electrically insulating conduit.

As is known in the art, the local magnetic field around the sample in sample holder 11 must be at a level for which the sample exhibits a maximum magnetic resonance absorption. Such a magnetic field for microwave frequencies is at a much higher level than the magnetic field produced by the earth and this magnetic field can be established either by a permanent magnet or an electromagnet or a combination of the two. For the best mode, three different magnetic fields were used. A reference magnetic field level was established by a fixed permanent magnet plus an electrically adjustable magnetic field. The third magnetic field was variable and supplied a sinusoidal field modulation.

The variable magnetic field 16 includes all three magnetic fields and produces the predetermined local magnetic field at the sample holder 11 for the electron paramagnetic resonance measurement. The sinusoidal modulation of the magnetic field produced by variable magnetic field 16 results in an amplitude modulation of the microwave signal as a result of the field-dependent magnetic resonance absorption.

The demodulator 13 demodulates the modulated microwave signal exiting from the sample cavity 11 and provides first and second harmonic signals with respect to the magnetic field moduluation frequency. The first harmonic signal was used to derive a magnetic field correction signal in order to maintain the local magnetic field at the point of maximum resonance absorption of the sample corresponding to the microwave frequency being used. This magnetic field adjustment was accomplished by a phase-sensitive detector whose output signal was coupled into the variable magnetic field 16 to establish a change in the level of the adjustable magnetic field. The phase-sensitive detector 17 determines both the amplitude and positive or negative sense of the first harmonic signal. The sense of the magnetic field correction signal determines the direction to change the adjustable magnetic field. The first harmonic signal has a value of zero at the maximum magnetic resonance absorption.

The demodulator 13 also provides the second harmonic signal which is compared in detector 18 to the field modulation frequency of the variable magnetic field 16. Detector 18 in the best mode was a lock-in amplifier. The detector 18 forms output means for the apparatus and can be interfaced with additional equipment which will translate the output signal level into information which is correlated to the properties of the sample being evaluated.

I wish it to be understood that I do not desire to be limited to the exact details of construction shown and described, for obvious modifications will occur to a person skilled in the art.

Having thus described the invention, what I claim as new and desire to be secured by Letters Patent, is as follows:

1. A magnetic resonance apparatus comprising; first means for producing a microwave signal having a microwave frequency; second means for holding a sample to be irradiated by said microwave signal; third means for producing in the region of the sample a magnetic field that is modulated with respect to a reference magnetic field level; said sample exhibiting a maximum resonance absorption at the reference magnetic field level and said microwave frequency; whereby said moduluated magnetic field causes the absorbance of said sample to vary in synchronism with the magnetic field modulation resulting in amplitude modulation of said microwave signal containing first and second harmonic signals with respect to the frequency of said modulated magnetic field; fourth means for demodulating said microwave signal to obtain said first and second harmonic signals; fifth means for producing a magnetic field correction signal from said first harmonic signal to change said reference magnetic field level to maintain said maximum microwave signal absorption of said sample at said microwave frequency; and output means for said second harmonic signal; whereby, the second harmonic signal provides a property of said sample.

2. The apparatus of claim 1, wherein said second means comprises a resonant microwave means for producing a resonant response and further comprising modulating means for frequency modulating said microwave signal before it irradiates said sample to produce a microwave frequency correction signal for said first means in order to maintain said microwave signal at the frequency of said resonant microwave means.

3. The apparatus of claim 1, wherein said variable magnetic field comprises at least two separate electromagnetic coils, one to produce a reference magnetic field level and the other to produce a variable magnetic field.

4. The apparatus of claim 1, wherein said fifth means comprises at least one phase-sensitive detector.

* * * * *